(12) United States Patent
Lee et al.

(10) Patent No.: US 7,570,491 B2
(45) Date of Patent: *Aug. 4, 2009

(54) PRINTED CIRCUIT BOARD WITH EMBEDDED CAPACITORS THEREIN, AND PROCESS FOR MANUFACTURING THE SAME

(75) Inventors: Seok-Kyu Lee, Chungchungbuk-do (KR); Byoung-Youl Min, Seoul (KR); Chang-Hyun Nam, Gyeongsangbuk-do (KR); Hyun-Ju Jin, Busan (KR); Jang-Kyu Kang, Daejeon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 586 days.

This patent is subject to a terminal disclaimer.

(21) Appl. No.: 10/728,591

(22) Filed: Dec. 4, 2003

(65) Prior Publication Data

US 2004/0121266 A1    Jun. 24, 2004

(30) Foreign Application Priority Data

Dec. 23, 2002  (KR)  .................. 10-2002-0082648

(51) Int. Cl.
*H05K 1/02* (2006.01)
*H05K 1/16* (2006.01)

(52) U.S. Cl. .................. 361/748; 361/763; 430/311; 430/313; 174/260

(58) Field of Classification Search ................. None
See application file for complete search history.

(56) References Cited

U.S. PATENT DOCUMENTS

| 5,079,069 | A | 1/1992 | Howard et al. | |
|---|---|---|---|---|
| 5,261,153 | A | 11/1993 | Lucas | |
| 5,800,575 | A | 9/1998 | Lucas | |
| 6,274,224 | B1 | 8/2001 | O'Bryan et al. | |
| 6,370,013 | B1 * | 4/2002 | Iino et al. | 361/306.3 |
| 6,910,266 | B2 * | 6/2005 | Lee et al. | 29/832 |
| 2003/0128496 | A1 * | 7/2003 | Allen et al. | 361/306.3 |
| 2004/0116919 | A1 * | 6/2004 | Heim et al. | 606/34 |

* cited by examiner

*Primary Examiner*—John A McPherson
*Assistant Examiner*—Daborah Chacko Davis
(74) *Attorney, Agent, or Firm*—Christensen O'Connor Johnson Kindness PLLC

(57) ABSTRACT

Disclosed herein is a printed circuit board with embedded capacitors therein which comprises inner via holes filled with a high dielectric polymer capacitor paste composed of a composite of $BaTiO_3$ and an epoxy resin, and a process for manufacturing the printed circuit board.

8 Claims, 14 Drawing Sheets

PRINTED CIRCUIT BOARD WITH EMBEDDED CAPACITORS THEREIN, AND PROCESS FOR MANUFACTURING THE SAME

BACKGROUND OF THE INVENTION

1. Field of the Invention

The present invention relates to a printed circuit board with embedded capacitors therein, and a process for manufacturing the printed circuit board. More particularly, the present invention relates to a printed circuit board with embedded capacitors therein which comprises inner via holes (IVH) filled with a high dielectric polymer capacitor paste composed of a composite of $BaTiO_3$ and an epoxy resin, and a process for manufacturing the printed circuit board.

2. Description of the Related Art

Common discrete chip resistors or discrete chip capacitors have been mounted on the surfaces of conventional printed circuit boards (PCBs). Recently, printed circuit boards with embedded passive devices such as resistors, capacitors, etc. therein are developed.

Such printed circuit boards with embedded passive devices therein are manufactured by a process comprising inserting passive devices such as resistors, capacitors, etc., into an inner or outer layer of a substrate using novel materials (substances) and processes, thereby replacing the functions of conventional chip resistors and chip capacitors. That is, the printed circuit boards with embedded passive devices therein include passive devices, e.g., capacitors, buried in the inner or outer layer of the substrate. The term "embedded capacitors" used herein refers to capacitors as passive devices which are mounted as parts of a printed circuit board, irregardless of the size of a substrate. The substrate is referred to as "embedded capacitor PCB". The most important advantage of the embedded capacitor PCB is that since the capacitors are mounted as parts of the printed circuit board, there is no need to mount the capacitors on the surfaces of the printed circuit board.

On the other hand, recent techniques for manufacturing the embedded capacitor printed circuit board are largely classified into the following three techniques:

The first technique is a method for manufacturing polymer thick film type capacitors comprising application of a polymer capacitor paste and thermal curing (that is, drying) of the paste. Specifically, according to this method, the embedded capacitors are formed by applying the polymer capacitor paste to the printed circuit board inner layer, drying the polymer capacitor paste, printing a copper paste on the resulting printed circuit board to form electrodes and drying the copper paste.

The second technique is a method for manufacturing embedded discrete type capacitors comprising coating a ceramic filled photo-dielectric resin onto a printed circuit board. The related patent is owned by Motorola Inc. Specifically, according to this method, the discrete capacitors are formed by coating the photo-dielectric resin containing ceramic powders onto both surfaces of a substrate, laminating copper foils thereto to form respective top electrodes and bottom electrodes, forming circuit patterns thereon, and etching the photo-dielectric resin.

The third technique is a method for manufacturing power distributed decoupling capacitors comprising inserting dielectric layers having a capacitance characteristic into the printed circuit board inner layer, thereby replacing decoupling capacitors mounted on the surfaces of the conventional printed circuit boards. The related patent is owned by Sanmina Corp. Specifically, according to this method, power distributed decoupling capacitors are formed by a process comprising inserting dielectric layers composed of power electrodes and ground electrodes into the dielectric layers of the printed circuit board.

A variety of processes are developed based on the three techniques discussed above. Procedures for carrying out the processes are different from each other. Since a market for the printed circuit boards with embedded capacitors therein is small, the standardization of these techniques is not yet achieved and trials to develop commercially available processes are still ongoing.

Hereinafter, printed circuit boards with embedded capacitors therein and the processes for manufacturing the printed circuit boards according to the prior arts will be explained in more detail with reference to the accompanying drawings.

The first prior art is explained with reference to FIGS. 1a to 1e.

FIGS. 1a to 1e are sectional views showing a process for manufacturing a printed circuit board with embedded polymer thick film type capacitors therein according to the first prior art. Referring to FIGS. 1a to 1e, the printed circuit board with embedded polymer thick film type capacitors is manufactured by a process comprising application of a polymer capacitor paste and thermal drying (that is, curing) of the paste.

In step 1, a dry film is coated onto a copper foil of a PCB inner layer 42 composed of FR-4, and then subject to light exposure and development. The copper foil is etched to form copper foils 44a and 44b for positive (+) electrodes, copper foils 43a and 43b for negative (−) electrodes and clearances formed therebetween (FIG. 1a).

In step 2, a capacitor paste, a polymer containing ceramic powders of high dielectric constant, is applied to the copper foils 43a and 43b for negative (−) electrodes using a screen-printing manner, and is then dried or cured (FIG. 1b). The screen-printing manner refers to a printing method in which a medium, e.g., ink, is passed through a stencil screen using a squeezer to form a pattern on a substrate surface.

At this step, screened capacitor pastes 45a and 45b cover the copper foils 44a and 44b for positive (+) electrodes, the copper foils 43a and 43b for negative (−) electrodes and the clearances formed therebetween.

In step 3, a conductive paste such as silver and copper paste is applied to the resulting structure using a screen-printing manner to form positive (+) electrodes 46a and 46b, and then dried or cured (FIG. 1c).

In step 4, the capacitor layer formed on a copper foil 41 of the PCB inner layer 42 formed through the previous steps 1 to 3 is inserted between insulators 47a and 47b, and then the three layers are laminated to each other (FIG. 1d).

In step 5, through-holes (TH) and laser blinded via holes (LBVH) 49a and 49b are formed on the laminated product. The capacitors present in the interior of the laminated product are connected to corresponding positive (+) terminals 51a and 51b and negative terminals 50a and 50b of IC chips 52a and 52b through via the through-holes (TH) and the laser blinded via holes (LBVH) 49a and 49b, respectively. Accordingly, the capacitors function as embedded capacitors (FIG. 1e).

One of the problems concerning the first technique of the conventional techniques discussed above is the occurrence of cracks of the capacitor pastes 45a and 45b at ends of the positive (+) electrodes 46a and 46b.

FIGS. 2a and 2b are sectional views illustrating problems of the printed circuit board manufactured by the process shown in FIGS. 1a to 1e, respectively.

Referring to FIG. 1b, when the capacitor pastes 45a and 45b are printed on the copper foils 43a and 43b for negative (−) electrodes and dried in step 2 above, cracks (C) occur as shown in FIG. 2a. The occurrence of cracks (C) results from the thickness of the copper foils for negative (−) electrodes.

The copper foils of the PCB inner layer commonly have a thickness of ½ oz (18 μm) or 1 oz (36 μm). Since the thickness of the printed capacitors is about 10 μm, cracks occur at ends of the copper foils for negative (−) electrodes. The cracks also cause problems that when printing the copper pastes 45a and 45b connected to the copper foils 44a and 44b for positive (+) electrodes are printed, an interlayer short between the negative (−) electrodes and the positive (+) electrodes is poor.

In addition, the second problem concerning the first technique of the conventional techniques discussed above is non-uniform insulation distance between a first layer and a second layer shown in FIG. 1e.

When the embedded capacitors 45a and 45b are formed in accordance with the steps of FIG. 1a to 1e and the insulators 47a and 47b are laminated as shown in step 4, the difference between the insulation distance from the capacitors to a first layer (designated by A) and the insulation distance from a second layer (designated by B) or a third layer in the inner layer core to the first layer, becomes large (FIG. 2b). For example, when the insulators have a thickness of 80 μm, the insulation distance (A) from the copper power electrodes 46a and 46b of the inner layer capacitors to the first layer is 20~30 μm, while the insulation distance (B) from the FR-4 core 42 or the copper foils of the second layer to the first layer is 60~70 μm. The difference between the insulation distances is because both the capacitor pastes 45a and 45b and the copper power electrodes 46a and 46b have a thickness of 10~15 μm. The difference in the insulation distances leads to poor impedance of signal circuits in the first layer and the second layer.

Furthermore, the third problem concerning the first technique of the conventional techniques discussed above is the presence of impurities occurring during printing and drying of the capacitor pastes 45a and 45b.

As shown in FIG. 1b, after the capacitor pastes 45a and 45b are printed in a thickness of 10~15 μm, dried at 150° C. or higher for 30~90 minutes, the copper pastes 46a and 46b are printed thereon and dried. At this time, impurities occur during the printing. When the printed copper pastes 46a and 46b are dried, a number of voids are formed due to the impurities. The voids lead to a poor interlayer short between the positive (+) electrodes and the negative (−) electrodes when the copper pastes 46a and 46b connected to the copper foils 44a and 44b for positive (+) electrodes are printed on the capacitor pastes 45a and 45b and then dried.

Next, the second technique will be explained with reference to FIGS. 3a to 3c.

FIGS. 3a to 3f are sectional views showing a process for manufacturing a printed circuit board with embedded discrete capacitors formed by coating a photo-dielectric resin in accordance with a prior art. The embedded discrete type capacitors are formed by a process comprising coating the ceramic filled photo-dielectric resin onto a printed circuit board. The process will be explained with reference with U.S. Pat. No. 6,349,456 issued to Motorola Inc.

In step 1, a dielectric layer 14 containing ceramic powders is coated onto a substrate 10 on which a conductor layer 12 is formed, and then subjected to light exposure and thermal curing (FIG. 3a).

In step 2, a laminate copper foil 16 is applied to the surface of the dried dielectric layer 14 (FIG. 3b). The reference numeral 18 designates a sacrificial layer tin-plated onto the copper foil 16 to use as a copper etching resist.

In step 3, a dry film is laminated to the sacrificial layer 18, and then exposed to light and developed. The sacrificial layer 18 and the copper foil 16 are etched to form top electrodes 20 (FIG. 3c).

In step 4, the dielectric layer 14 underlying the top electrode 20 is exposed to light, and then the resulting dielectric layers 22 are etched. The top copper electrodes 20 serve as photomasks for the dielectric layer 14 (FIG. 3d).

In step 5, the copper foil 12 underlying the etched dielectric layers 22 is etched to form bottom electrodes 24 (FIG. 3e).

In final step 6, the capacitor layer 32 formed through the previous steps 1 to 5 is inserted between insulators 26, and then metal layers are laminated thereon (FIG. 3f).

Thereafter, the capacitors 32 present in the interior of the laminated product are connected to corresponding power terminals and ground terminals of IC chips mounted on the exterior of the laminated product through via the through-holes (TH) and the laser blinded via holes (LBVH), respectively.

The first problem concerning the second technique of the conventional techniques discussed above is high manufacturing cost.

That is, in order to manufacture the embedded discrete type capacitors by coating the ceramic filled photo-dielectric resin 14 onto the substrate, both the top electrode 20 and the bottom electrode 24 must be formed. In this case, many steps, which greatly increase manufacturing cost, are required. In addition, since the technique comprises printing the photo-dielectric resin 14 on the entire surface of the bottom electrodes 12 (a copper foil layer), exposing to light, and etching to remove regions responded to light, more of the photo-dielectric resin than expected is required even to form a small number of the embedded capacitors. Accordingly, the technique is economically disadvantageous in terms of considerable loss of raw materials.

The second problem concerning the second technique of the conventional techniques discussed above is interlayer shorts between the bottom electrodes 24.

Specifically, the laminate copper foil 16 is circuit-formed to form the top electrodes 20. When the photo-dielectric resin 14 underlying the copper foil 16 is exposed to light, followed by etching using an etchant to remove regions responded to light, the width of the removed regions may be small. The small width carries a risk that the unetched dielectric resin 14 may remain at the surface of the copper foil 12. This is because when the photo-dielectric resin 14 is thermally cured (110° C., 60 min.), a photosensitive agent present in the photo-dielectric resin 14 is not completely reacted. In particular, the photo-dielectric resin 14 located in the lower copper foil 12 may be unetched, thus resulting in unetched lower copper foil 12. Finally, interlayer shorts between the bottom electrodes 24 may occur.

Next, the third conventional technique will be explained in more detail with reference to FIGS. 4a to 4c.

FIGS. 4a to 4c are sectional views showing a process for manufacturing a printed circuit board with embedded capacitors by inserting a dielectric layer having a capacitance characteristic, in accordance with a prior art. The embedded capacitors are formed by a process comprising inserting a separate dielectric layer having a capacitance characteristic into the printed circuit board inner layer. The embedded capacitors thus manufactured can replace decoupling capacitors mounted to the surface of the substrate. The process will be explained with reference with U.S. Pat. Nos. 5,079,069, 5,261,153 and 5,800,575 issued to Sanmina Corp.

In step 1, a dry film is deposited on a high electric copper coated laminate 61 between copper foils 63a and 63b, and subjected to light exposure and development. Then, the copper foils 63a and 63b are etched to form power electrodes and clearances (FIG. 4a).

In step 2, the resulting structure is inserted between insulators 64a and 64b, and then outer-layer copper foils 65a and 65b are laminated thereto (FIG. 4b).

In step 3, the capacitors present in the interior of the laminated product are connected to corresponding power terminals and ground terminals of IC chips 68a and 68b mounted on the exterior of the laminated product through via throughholes (TH) and laser blinded via holes (LBVH), respectively. The capacitors serve as power distributed decoupling capacitors (FIG. 4c). Reference numerals 67a and 67b designate a ground electrode and a power electrode, respectively. When the through-holes and laser blinded via holes are formed between the ground electrode and the power electrode, they are spaced sufficiently apart from the ground electrode and the power electrode not to contact one another.

The first problem concerning the third technique of the conventional techniques discussed above is low capacitance due to low dielectric constant of the embedded capacitor layer.

Specifically, in the case of a thin film type having a thickness of 10~50 μm as shown in FIG. 4a, FR-4 (manufactured by Sanmina Corp.) having a thickness of 25 μm or 50 μm as a dielectric material is disposed between the copper foils used as power electrodes and ground electrodes. The FR-4 has a dielectric constant of 4~5 and a capacitance value per unit area of 0.5~1 nF/in$^2$. Since the capacitance value of the FR-4 is considerably low, compared to that of currently used decoupling discrete chip capacitors (100 nf/in$^2$), there is a limitation in manufacturing embedded capacitors.

The second problem concerning the third technique of the conventional techniques discussed above is an increase the thickness of a printed circuit board due to insertion of embedded capacitor layers.

Specifically, in order to manufacture a printed circuit board with embedded capacitors therein having a high capacitance using the FR-4 dielectric material, the insertion of a large number of embedded capacitor layers, which increases in thickness of the printed circuit board to be manufactured, is required. Accordingly, the technique is economically disadvantageous in terms of increased manufacturing cost.

The third problem concerning the third technique of the conventional techniques discussed above is the occurrence of interlayer shorts and cracks between power electrodes and ground electrodes. Specifically, in the case of using a thin dielectric material to obtain a high capacitance value, during dry film lamination and circuit formation of an upper copper foil for power electrodes and a lower copper foil for ground electrodes, as shown in FIG. 5, interlayer shorts and cracks between the power electrodes and the ground electrodes occur.

FIG. 5 is a sectional view illustrating a problem of a printed circuit board with embedded capacitors therein manufactured by a process comprising inserting a dielectric layer having a capacitance characteristic, in accordance with a prior art. In a printed circuit board with embedded capacitors therein, the capacitors being formed by inserting a dielectric layer having a capacitance characteristic in accordance with a prior art, interlayer shorts (designated by G) and cracks (designated by F) between power electrodes 92 having a thickness of 18~35 μm and ground electrodes 93 on a high dielectric layer 91 having a thickness of 8~10 μm occur, as shown in FIG. 5.

On the other hand, capacitance is dependent on the area and thickness of a capacitor, and is given by the following equation 1:

$$C = \varepsilon_r \cdot \varepsilon_0 \left(\frac{A}{D}\right) \quad \text{Equation 1}$$

wherein $\varepsilon_r$ is the dielectric constant of a dielectric material, $\varepsilon_o$ is a constant of $8.885 \times 10^{-8}$, A is the surface area of the dielectric material, and D is the thickness of the dielectric material. That is, in order to obtain of high capacity capacitors, the dielectric constant of a dielectric material must be high, the thickness of the dielectric material must be small, and the surface area of the dielectric material must be large. In addition, when the thickness is 10 μm, the capacitance of the bimodal polymer ceramic composite is 5~7 nF/cm$^2$.

For example, according to U.S. Pat. No. 6,274,224 issued to 3M Innovative Properties Co., a thin film type dielectric material is disposed between the copper foils used as power electrodes and ground electrodes. The dielectric material is a composite of high dielectric BaTiO$_3$ ceramic powders and a thermosetting epoxy resin or polyimide and has a thickness of 8~10 μm. Although the dielectric material has a relatively high capacitance (10 nF/in$^2$) per unit area, there are problems of interlayer shorts and cracks between power electrodes and ground electrodes due to low thickness of the dielectric material.

SUMMARY OF THE INVENTION

Therefore, the present invention has been made in view of the above problems, and it is an object of the present invention to provide a printed circuit board with embedded capacitors therein and a process for manufacturing the printed circuit board wherein only desired regions of the printed circuit board can be filled with a paste and unnecessary steps such as etching of dielectric material can be eliminated, thereby decreasing the use of expensive raw materials and facilitating the manufacture of the printed circuit board at low cost.

It is another object of the present invention to provide a printed circuit board with embedded capacitors therein and a process for manufacturing the printed circuit board wherein the capacitance per unit area can be ensured with more precision using via holes formed on a non-copper clad FR-4.

It is yet another object of the present invention to provide a printed circuit board with embedded capacitors therein, and a process for manufacturing the printed circuit board wherein circuits and embedded capacitors can be formed on existing printed circuit board layers without the need for additional printed circuit board layers.

In order to accomplish the above objects of the present invention, there is provided a process for manufacturing a printed circuit board with embedded capacitors therein, comprising the steps of:

i) forming a plurality of inner via holes on predetermined regions of a non-copper clad laminate;

ii) filling the via holes with a capacitor paste;

iii) providing copper foil layers on both upper and lower surfaces of the capacitor paste, respectively;

iv) forming predetermined dry film patterns on the copper foil layers;

v) exposing to light and developing the dry film patterns to form top electrodes, bottom electrodes and signal circuit patterns;

vi) laminating resin coated copper (RCC) layers to the top electrodes, the bottom electrodes and the signal circuit patterns;

vii) forming predetermined outer via holes and through-holes in the resin coated copper layers; and viii) plating the inner walls of the outer via holes and the through-holes.

In a preferred embodiment of the present invention, the non-copper clad laminate is an FR-4 insulator.

The process for manufacturing a printed circuit board according to the present invention may further include the step of drying to cure the filled capacitor paste in the via holes. At this step, the capacitor paste is dried in an oven drier at 150~170° C. for 30 minutes.

The process for manufacturing a printed circuit board according to the present invention may further include the step of polishing to smooth overfilled capacitor paste so as to adjust the cured capacitor paste to a uniform height.

In a preferred embodiment of the present invention, the capacitor paste is smoothed using a ceramic buff.

In a preferred embodiment of the present invention, the via holes are filled with the capacitor paste using a screen-printing manner.

In a preferred embodiment of the present invention, the capacitor paste is preferably a composite of high dielectric $BaTiO_3$ ceramic powders having a dielectric constant of 1,000~10,000 and a thermosetting epoxy resin or polyimide. The $BaTiO_3$ ceramic powders may be bimodal in terms of their particle size. That is, the $BaTiO_3$ powders are composed of coarse powders having a particle diameter of 0.9 μm and fine powders having a particle diameter of 60 nm, with a volume ratio in the range of 3:1~5:1. The $BaTiO_3$ powders are homogeneously dispersed in the epoxy resin. The dispersion thus obtained is preferably a polymer ceramic composite having a dielectric constant of about 80~90.

In a preferred embodiment of the present invention, the copper foil layers are subjected to electroless plating or electro plating.

In a preferred embodiment of the present invention, the resin coated copper (RCC) layers are laminated by a build-up process.

In a preferred embodiment of the present invention, the outer via holes are formed using a laser drill, and the through-holes are formed using a mechanical drill.

In a preferred embodiment of the present invention, the outer via holes and the through-holes are subjected to electroless plating.

In accordance with another aspect of the present invention, there is provided a printed circuit board with embedded capacitors therein, comprising:

a) a non-copper clad laminate having a plurality of inner via holes formed on its predetermined regions;

b) a capacitor paste filled in the plurality of inner via holes formed on the non-copper clad laminate;

c) copper foil layers provided on both upper and lower surfaces of the capacitor paste, the copper foil layers including top electrodes, bottom electrodes and signal circuit patterns;

d) resin coated copper (RCC) layers laminated to the top electrodes, the bottom electrodes and the signal circuit patterns;

e) predetermined outer via holes and through-holes formed in the resin coated copper layers; and f) plating layers plated in the inner walls of the outer via holes and the through-holes.

In accordance with the present invention, the capacitor pastes are connected to corresponding power pads and ground pads of IC chips mounted on the exterior of the printed circuit board through the via holes filled with the capacitor paste, respectively. Accordingly, the printed circuit board in which capacitors are substantially embedded can be easily manufactured.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, a printed circuit board with embedded capacitors therein and a process for manufacturing the printed circuit board according to the embodiments of the present invention will be explained in more detail with reference to the accompanying drawings.

Figure 1A:
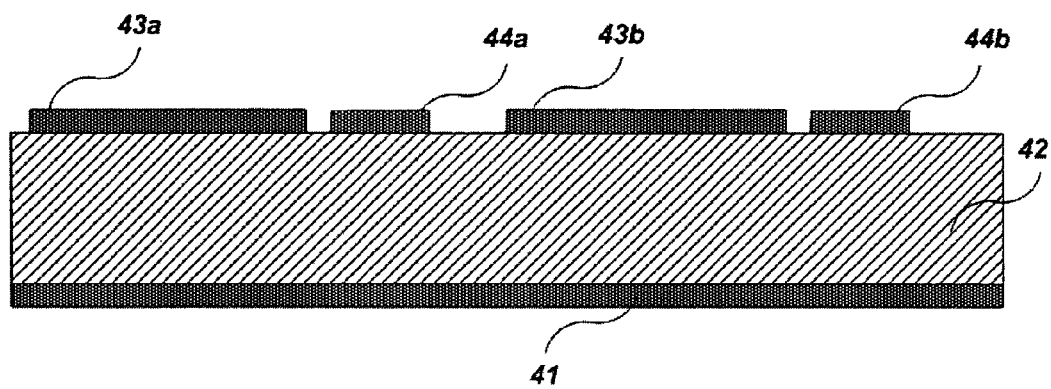
FIGS. 1a to 1e are sectional views showing a process for manufacturing a printed circuit board with embedded polymer thick film type capacitors therein according to a prior art.
Figure 1B:
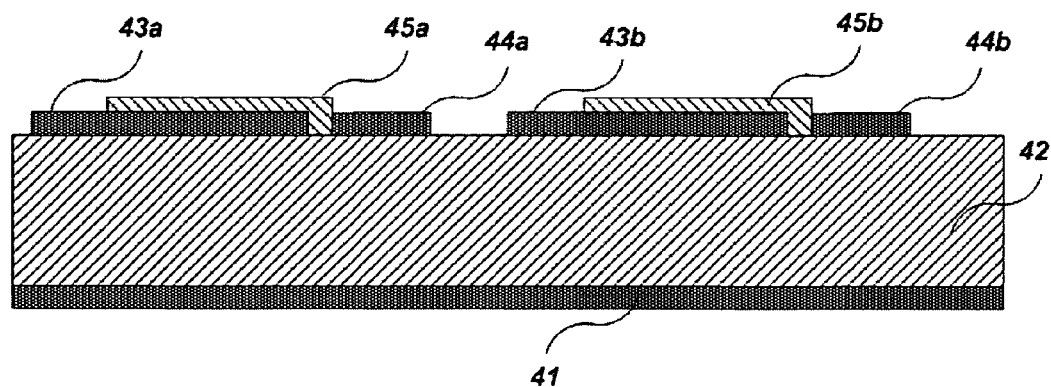
Figure 1C:
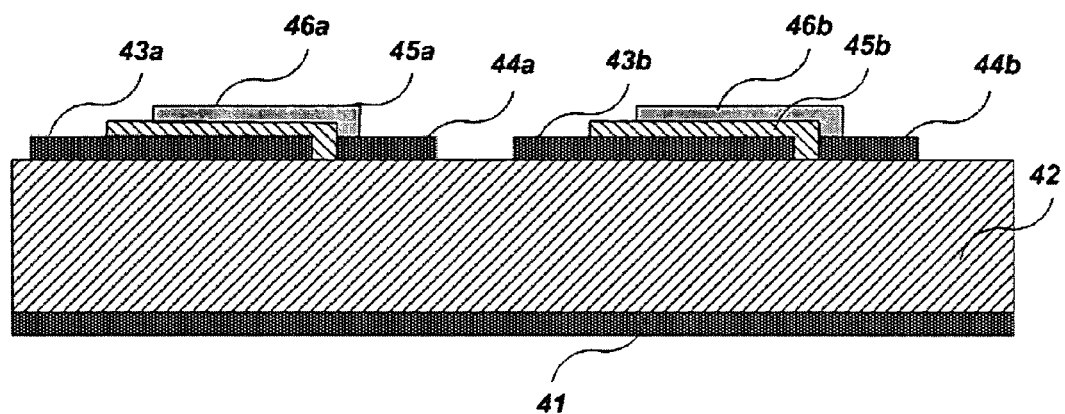
Figure 1D:
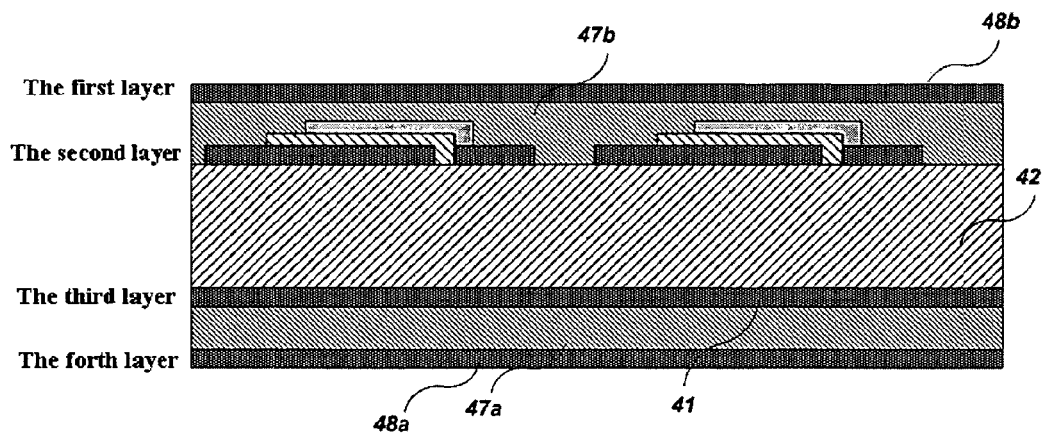
Figure 1E:
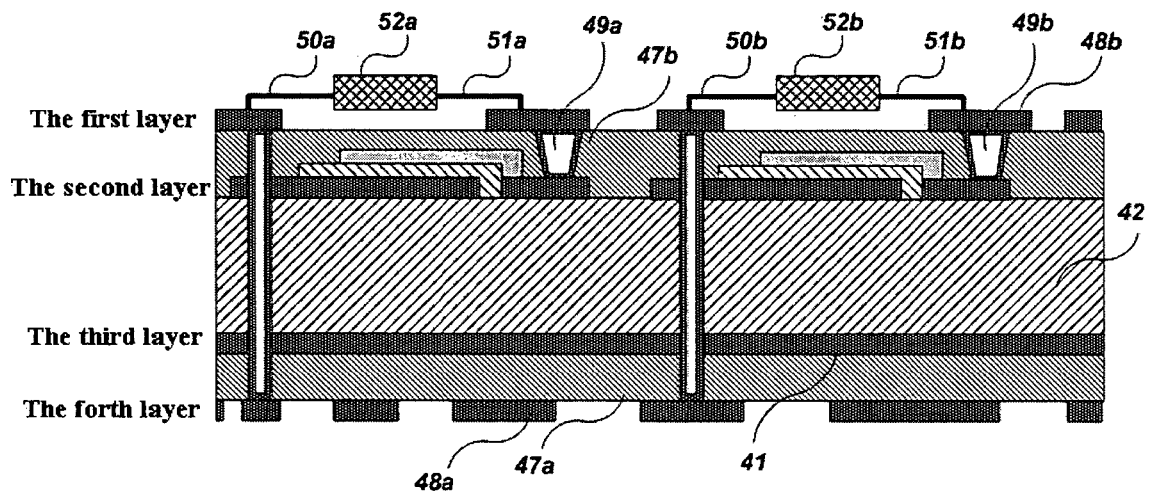
Figure 2A:
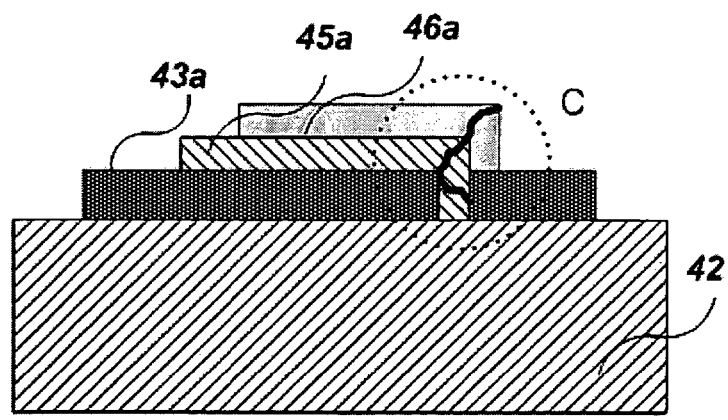
FIGS. 2a and 2b are sectional views illustrating problems of the printed circuit board manufactured by the process shown in FIGS. 1a to 1e, respectively.
Figure 2B:
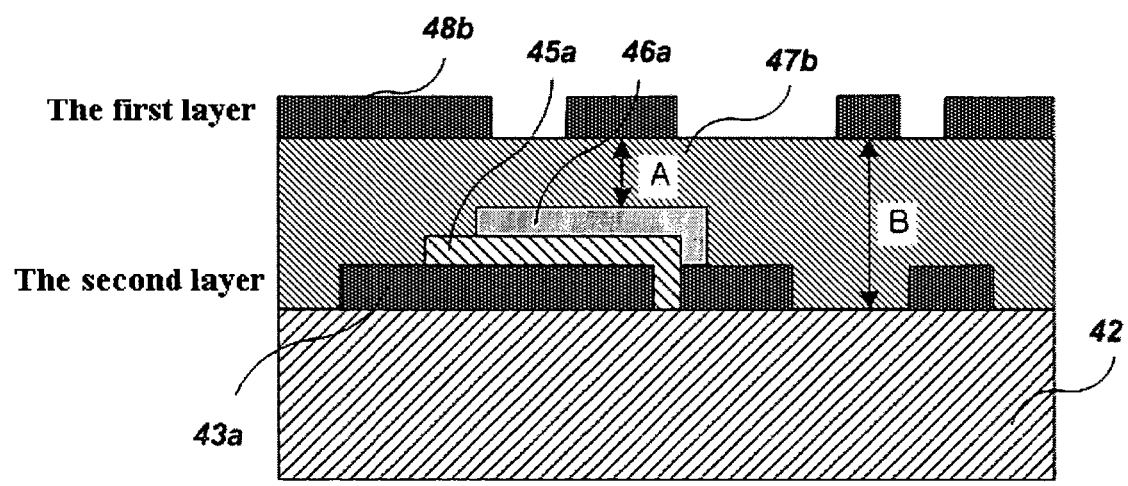
Figure 3A:
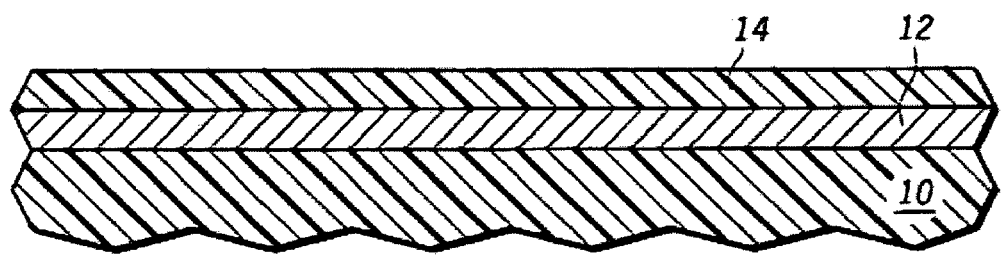
FIGS. 3a to 3f are sectional views showing a process for manufacturing a printed circuit board with embedded discrete capacitors formed by coating a photo-dielectric resin in accordance with a prior art.
Figure 3B:
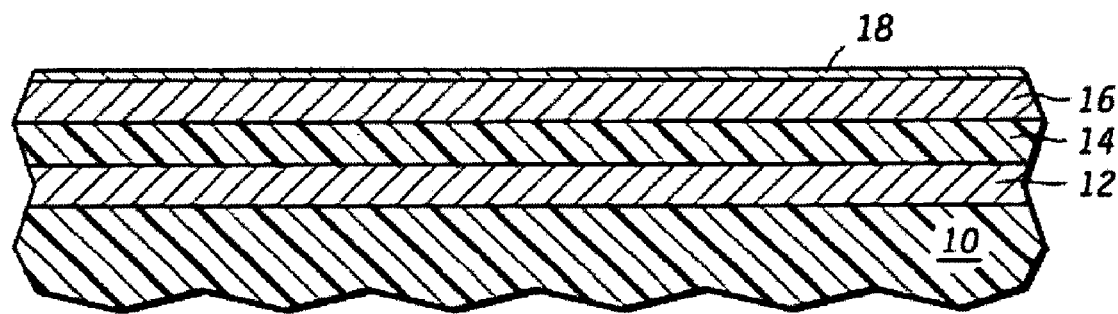
Figure 3C:
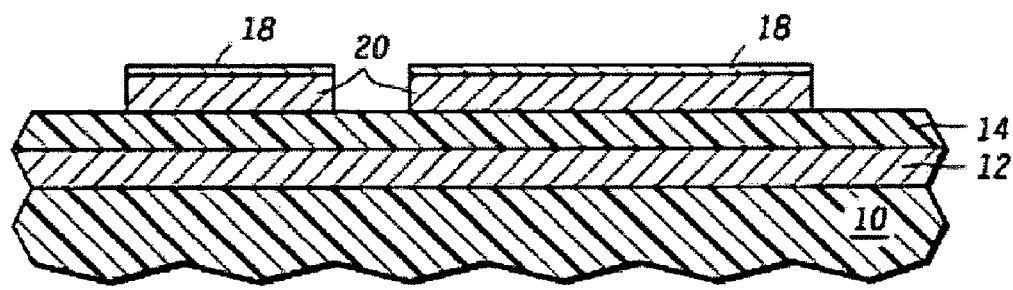
Figure 3D:
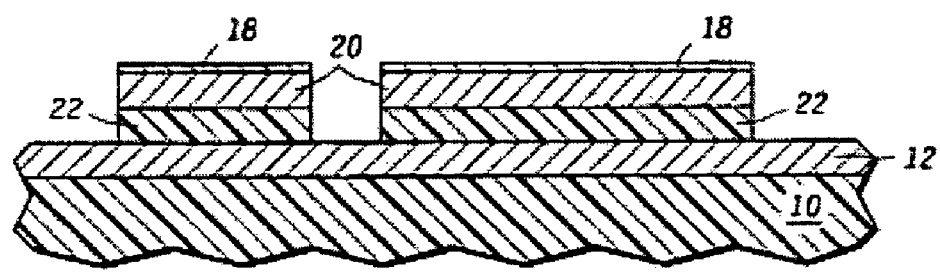
Figure 3E:
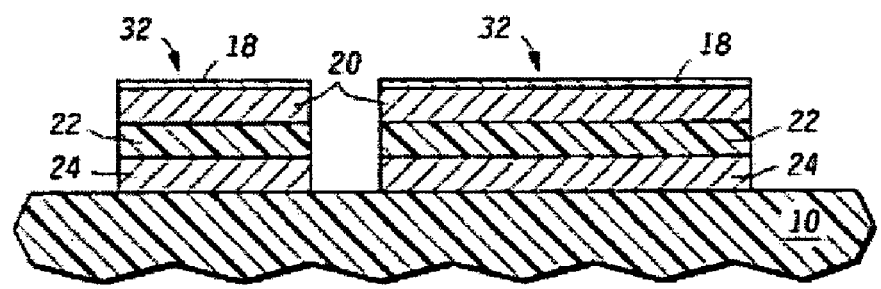
Figure 3F:
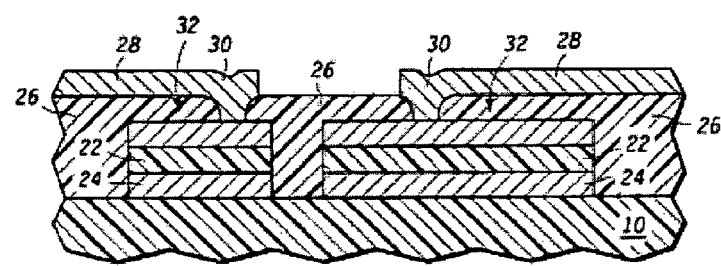
Figure 4A:
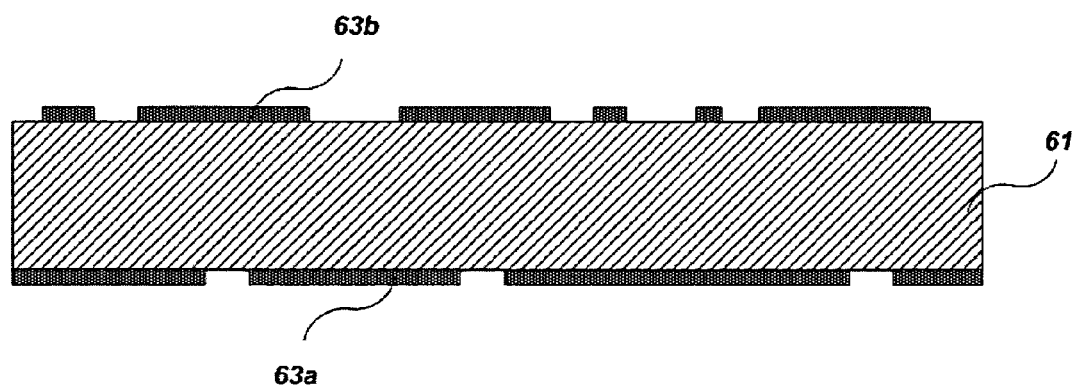
FIGS. 4a to 4c are sectional views showing a process for manufacturing a printed circuit board with embedded capacitors therein by inserting a dielectric layer having a capacitance characteristic, in accordance with a prior art.
Figure 4B:
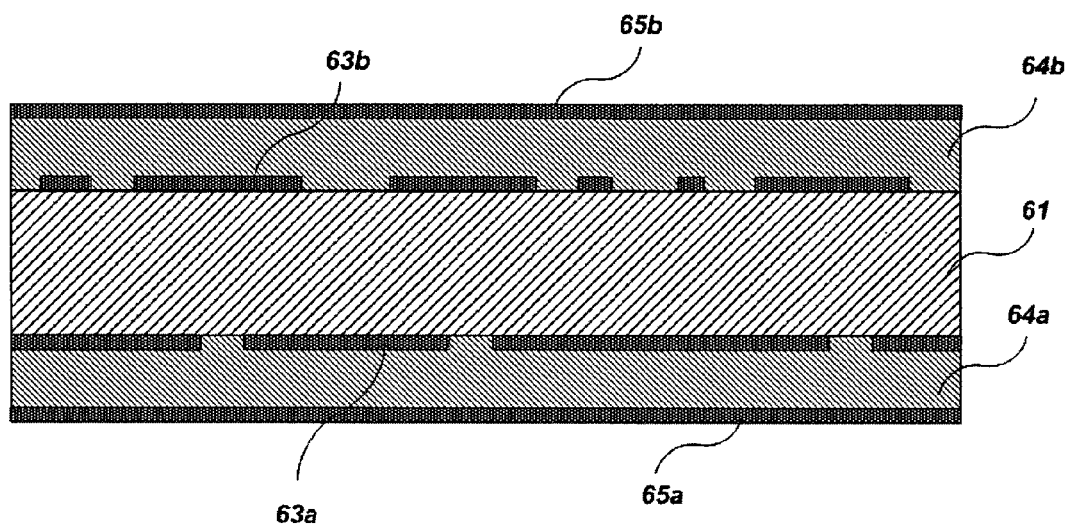
Figure 4C:
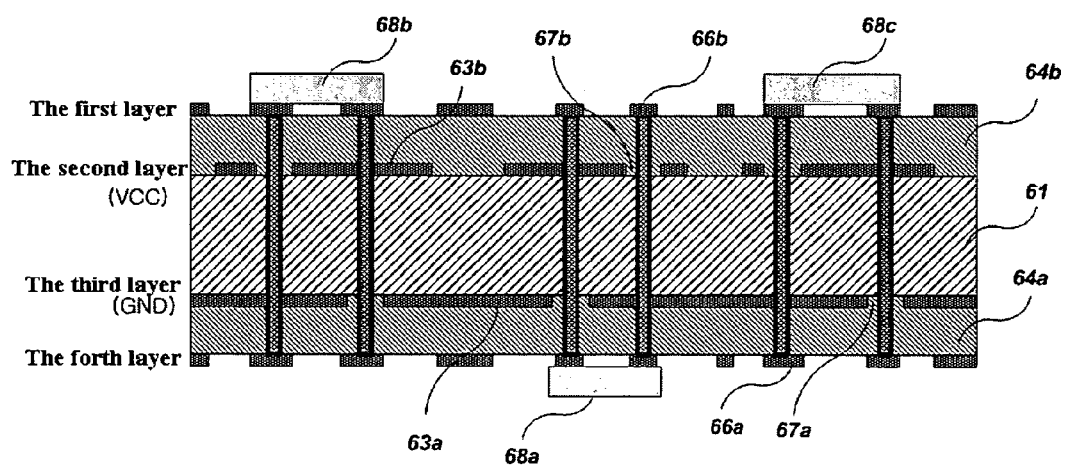
Figure 5:
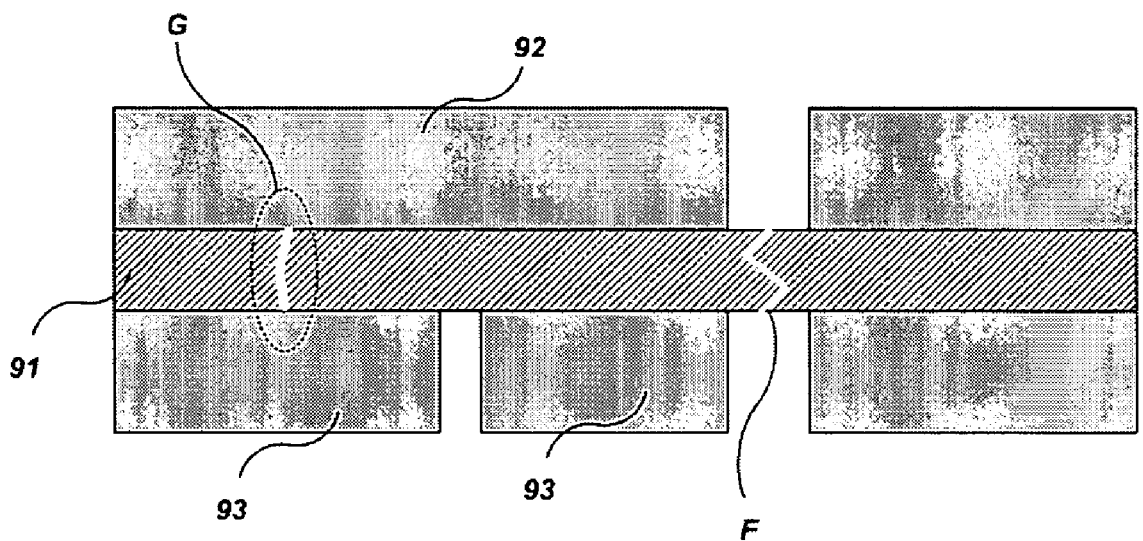
FIG. 5 is a sectional view illustrating a problem of the printed circuit board manufactured by the process shown in FIGS. 4a to 4c.
Figure 6:
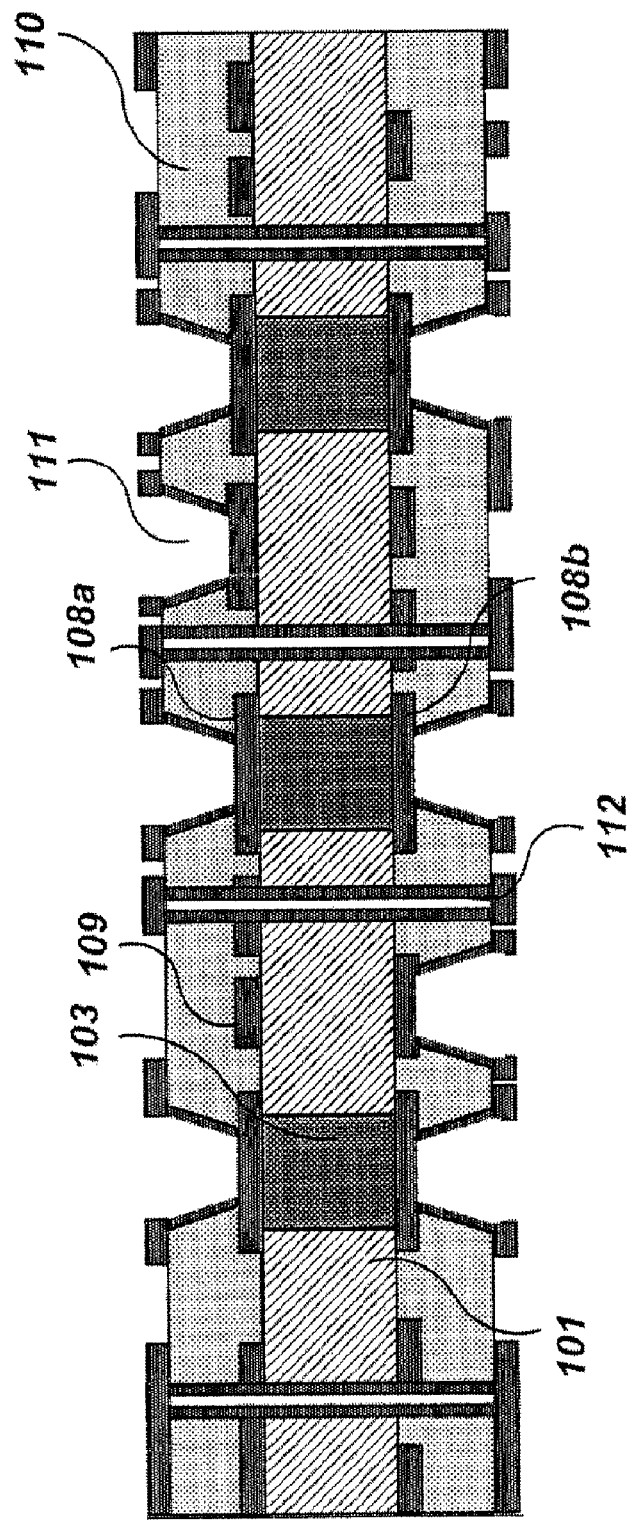
FIG. 6 is a cross-sectional view showing a printed circuit board with embedded capacitors therein according to the present invention.

FIG. 6 is a cross-sectional view showing a printed circuit board with embedded capacitors therein according to the present invention which comprises inner via holes filled with a polymer capacitor paste.

Referring to FIG. 6, the printed circuit board with embedded capacitors therein according to the present invention comprises: a) a non-copper clad laminate 101 having a plurality of inner via holes formed on its predetermined regions; b) capacitor pastes 103 filled in the plurality of inner via holes formed on the non-copper clad laminate 101; c) copper foil layers 108a, 108b and 109 provided on both upper and lower surfaces of the capacitor pastes 103, the copper foil layers including top electrodes 108a, bottom electrodes 108b and signal circuit patterns 109; d) resin coated copper (RCC) layers 110 laminated to the top electrodes, the bottom electrodes and the signal circuit patterns; e) predetermined outer via holes 111 and through-holes 112 formed in the resin coated copper layers; and f) plating layers plated in the inner walls of the outer via holes and the through-holes.

In accordance with the present invention, the via holes formed on an existing signal circuit pattern layer are filled with the high dielectric polymer capacitor 103 so that the signal circuit patterns 109 and the capacitor are arranged in the same layer.

That is, the present invention is not related to a thin film type technique for replacing chip capacitors which form power layers and ground layers by the insertion of embedded capacitors having a high dielectric constant. The present invention relates to a technique for connecting the polymer capacitor pastes 103 to corresponding power pads and ground pads (not shown) of IC chips mounted on the exterior of the printed circuit board through the via holes filled with the capacitor pastes 103, respectively. Accordingly, the printed circuit board in which capacitors are substantially embedded can be easily manufactured.

Since the capacitor pastes 103 are a composite of $BaTiO_3$ ceramic powders (Dk: 1,000~10,000) having high dielectric constant and a thermosetting epoxy resin or polyimide, high capacitance can be achieved. In addition, the capacitor pastes 103 are preferably bimodal in terms of a particle size of $BaTiO_3$ powders. The $BaTiO_3$ powders are composed of coarse powders having a particle diameter of 0.9 μm and fine powders having a particle diameter of 60 nm, with a volume ratio in the range of 3:1~5:1. The BaTiO$_3$ powders are homogeneously dispersed in the epoxy resin. The dispersion thus obtained is a polymer ceramic composite having a dielectric constant of about 80~90.

Hereinafter, a process for manufacturing the printed circuit board according to the embodiments of the present invention will be explained in more detail with reference to FIGS. 7a to 7h.

FIGS. 7a to 7h are sectional views showing a process for manufacturing the printed circuit board with embedded capacitors therein according to the embodiments of the present invention.

Figure 7A:
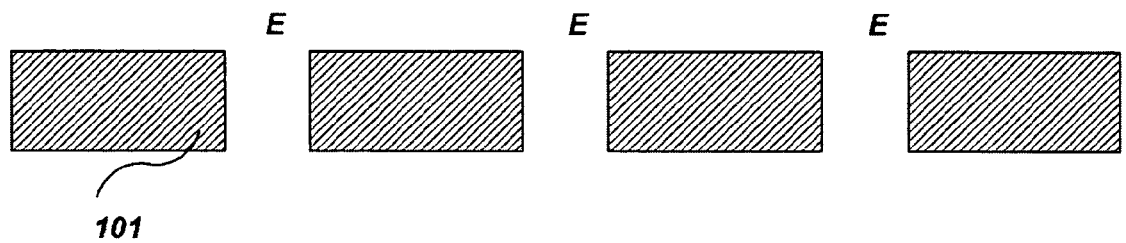
FIGS. 7a to 7h are sectional views showing a process for manufacturing a printed circuit board with embedded capacitors therein according to the embodiments of the present invention.
Figure 7B:
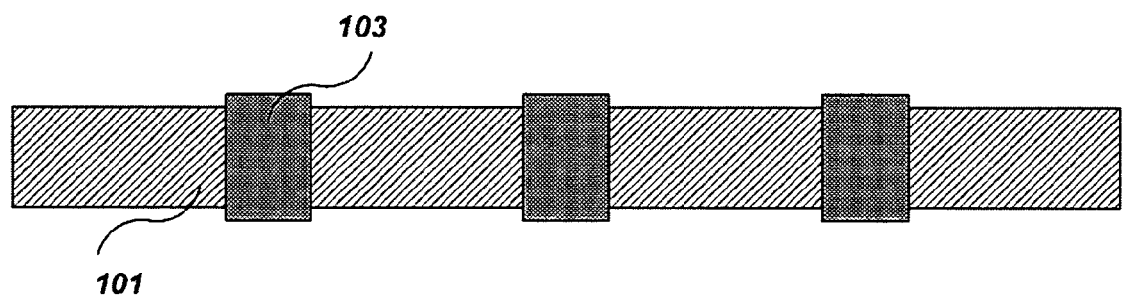

In step 1, inner via holes (IVH, designated by E) are formed on a non-copper clad laminate 101 composed of a common FR-4 insulator (FIG. 7a).

Figure 7C:
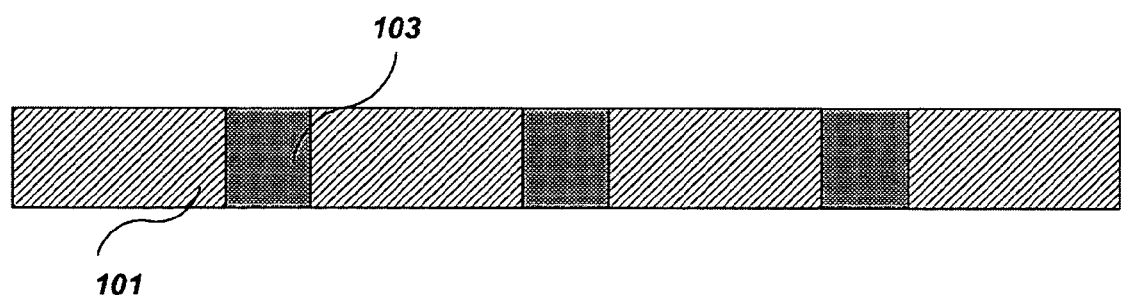

In step 2, the respective via holes (E) are filled with capacitor pastes 103 using a screen-printing manner, and then the capacitor pastes 103 are dried in a common oven drier at 150~170° C. for 30 minutes~1 hour (FIG. 7b) In step 3, 2~3 ∥m of the overfilled capacitor pastes are polished off using a ceramic buff so that thickness of the non-copper clad laminate 101 is adjusted to the height of the cured capacitor pastes 103 (FIG. 7c).

Figure 7D:
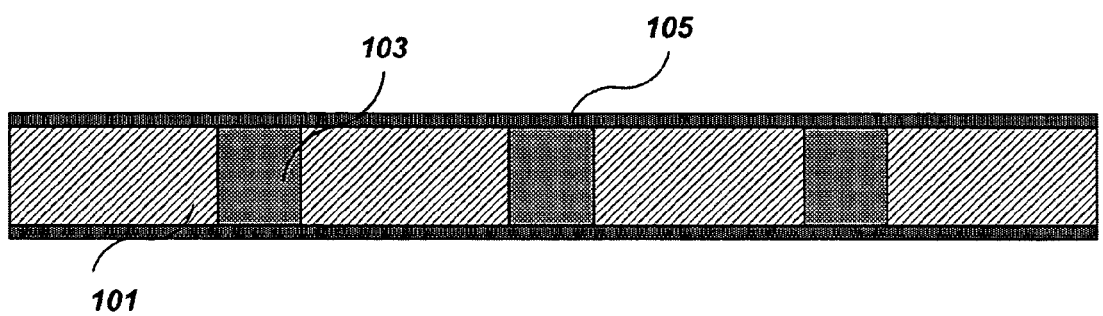

In step 4, the upper and lower surfaces of the non-copper foil FR-4 101 filled with the capacitor pastes 103 are plated to form copper foil layers 105. Specifically, the copper foil layers 105 are plated in the thickness of 1~2 μm using an electroless plating process, and further are plated in the thickness of 15 μm using an electro plating process (FIG. 7d).

Figure 7E:
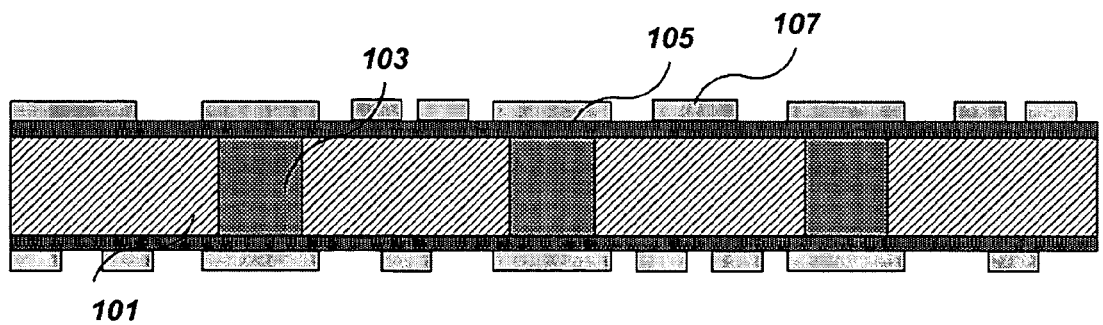

In step 5, photo resist dry films 107 are laminated to the upper and lower copper foil layers 105 and subjected light exposure and development to etch portions of the dry films 107 except for top electrodes and bottom electrodes (FIG. 7e).

Figure 7F:
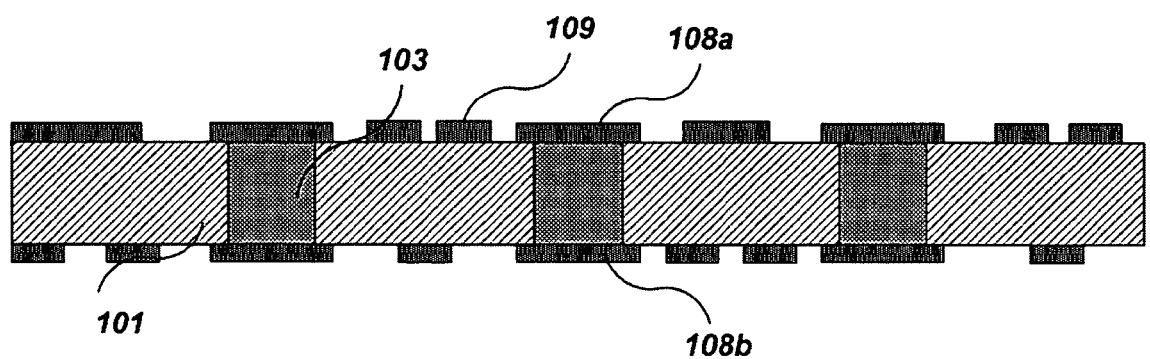

In step 6, predetermined regions of the copper foil layer 105 are etched to form top electrodes, bottom electrodes and signal circuit patterns. Thereafter, the dry films on the top electrode 108a, the bottom electrodes 108b and the signal circuit patterns 109 are removed. Accordingly, discrete capacitors filled with the capacitor pastes 103 are formed between the top electrodes 108a and the bottom electrodes 108b (FIG. 7f).

Figure 7G:
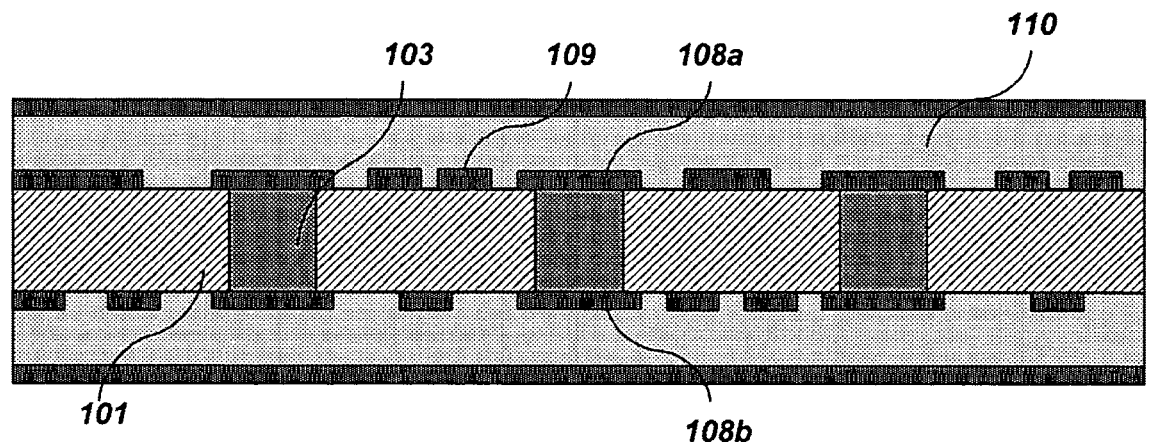

In step 7, resin coated copper (RCC) layers (110) are laminated to the entire surfaces of the capacitors top electrodes 108a, the bottom electrodes 108b and the signal circuit patterns 109 using a build-up process (FIG. 7g).

Figure 7H:
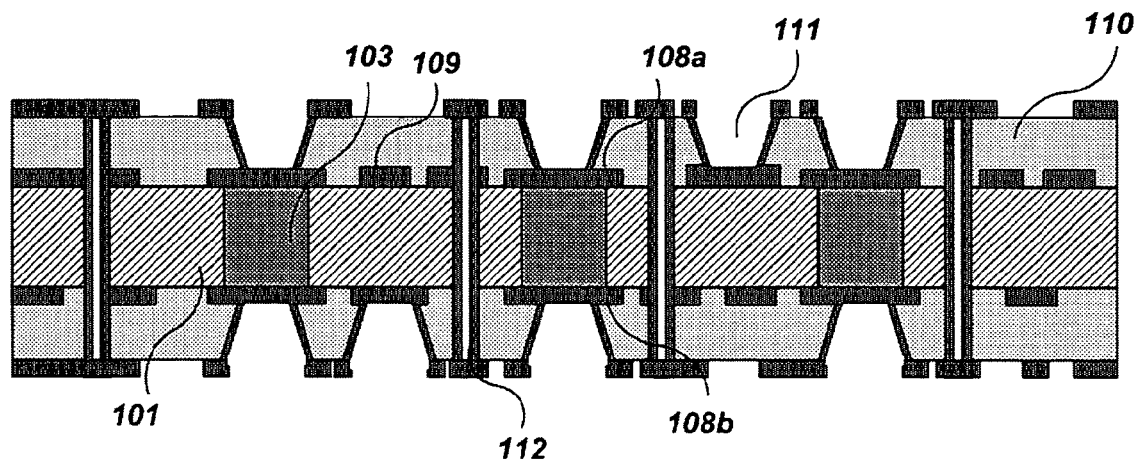

In step 8, outer via holes 111 are formed through the laminated resin coated copper layers 110 using a laser drill, and through-holes 112 are formed using a mechanical drill. Next, the inner via holes and the through-holes are plated using an electroless plating process (FIG. 7h). Finally, the polymer capacitor pastes are connected to corresponding power pads and ground pads (not shown) of IC chips mounted on the exterior of the printed circuit board through the via holes, respectively.

As described above, the present invention relates to a technique for connecting the polymer capacitor pastes 103 to corresponding power pads and ground pads of IC chips mounted on the exterior of the printed circuit board by forming via holes on an existing signal circuit pattern layer and filling the via holes with the capacitor pastes 103, respectively. In addition, an FR-4 (Dk 4.5) sheet as a dielectric material for forming capacitors is used in the technique of Sanmina Corp., while a ceramic powders-containing epoxy resin (Dk 70~90) in the form of a paste is used for forming capacitors in the present invention.

Furthermore, since the FR-4 dielectric sheet is used in the entire layers in order to manufacture the printed circuit board of Sanmina Corp., the number of layers of the printed circuit board is increased and the signal circuit patterns are not usable together with power layers and ground layers of the capacitor. In contrast, in the printed circuit board with embedded capacitors therein according to the present invention, the capacitors are formed by forming via holes on an existing signal circuit pattern layer and filling the via holes with the capacitor pastes 103, without the need for additional layers.

Moreover, according to the present invention, the capacitance per unit area can be ensured with more precision using the via holes which have uniform height and area and are filled with the capacitor pastes.

Unlike discrete capacitors of Motorola Inc. formed by a process comprising coating a photo-dielectric capacitor resin onto the entire layers and exposing to light and developing the coated layers, the printed circuit board with embedded capacitors therein of the present invention can be manufactured by a process comprising filling capacitors in via holes formed on only desired regions. Accordingly, the process for manufacturing the printed circuit board according to the present invention can eliminate unnecessary manufacturing steps.

As apparent from the above description, the present invention provides a printed circuit board with embedded capacitors therein and a process for manufacturing the printed circuit board wherein only desired regions of the printed circuit board can be filled with a paste and unnecessary steps such as etching of dielectric material can be eliminated, thereby decreasing the use of expensive raw materials and facilitating the manufacture of the printed circuit board at low cost.

In addition, according to the present invention, the capacitance per unit area can be ensured with more precision using via holes formed on a non-copper clad FR-4 and having uniform height and area.

Furthermore, according to the present invention, circuits and embedded capacitors can be formed on a conventional printed circuit board layer without the need for additional printed circuit board layers.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A printed circuit board with embedded capacitors therein, comprising:
   a) a non-copper clad laminate having a plurality of inner via holes formed on its predetermined regions, wherein the via holes define a perimeter;
   b) a capacitor paste filled in the plurality of inner via holes formed on the non-copper clad laminate, wherein the capacitor paste fills the via holes to the perimeter of the via holes and throughout the height of the via holes;
   c) copper foil layers provided on both upper and lower surfaces of the capacitor paste and the non-copper clad laminate, the copper foil layers forming top electrodes, bottom electrodes and signal circuit patterns, wherein a top electrode formed by a copper foil layer contacts the top of the capacitor paste at least over the area defined by the perimeter of the via hole and a bottom electrode formed by a copper foil layer contacts the bottom of the capacitor paste at least over the area defined by the perimeter of the via hole and wherein the signal circuit patterns are formed by a copper foil layer juxtaposed next to the top and bottom surfaces of the non-copper clad laminate at the height of the top and bottom electrodes of the capacitor;
   d) resin coated copper (RCC) layers laminated to the top electrodes, the bottom electrodes and the signal circuit patterns;

e) predetermined outer via holes and through-holes formed in the resin coated copper layers; and f) plating layers plated in the inner walls of the outer via holes and the through-holes.

2. A printed circuit board with embedded capacitors therein according to claim 1, wherein the non-copper clad laminate is an FR-4 insulator.

3. A printed circuit board with embedded capacitors therein according to claim 1, wherein the via holes are filled with the capacitor paste using a screen-printing manner.

4. A printed circuit board with embedded capacitors therein according to claim 1, wherein the capacitor paste is a composite of high dielectric $BaTiO_3$ ceramic powders having a dielectric constant of 1,000~10,000 and a thermosetting epoxy resin or polyimide.

5. A printed circuit board with embedded capacitors therein according to claim 1, wherein the capacitor paste is a polymer ceramic composite having a dielectric constant of about 80~90, the polymer ceramic composite being obtained by homogeneously dispersing the $BaTiO_3$ powders composed of coarse powders having a particle diameter of 0.9 μm and fine powders having a particle diameter of 60 nm (bimodal form) in the epoxy resin in a volume ratio of 3:1~5:1.

6. A printed circuit board with embedded capacitors therein according to claim 1, wherein the resin coated copper (RCC) layers are laminated by a build-up process.

7. A printed circuit board with embedded capacitors therein according to claim 1, wherein the outer via holes are formed using a laser drill.

8. A printed circuit board with embedded capacitors therein according to claim 1, wherein the through-holes are formed using a mechanical drill.

* * * * *

UNITED STATES PATENT AND TRADEMARK OFFICE
CERTIFICATE OF CORRECTION

PATENT NO. : 7,570,491 B2
APPLICATION NO. : 10/728591
DATED : August 4, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 868 days.

Signed and Sealed this

Seventh Day of September, 2010

David J. Kappos
*Director of the United States Patent and Trademark Office*